United States Patent
Ko

(10) Patent No.: US 9,419,606 B2
(45) Date of Patent: Aug. 16, 2016

(54) STACKED SEMICONDUCTOR ARRANGEMENT

(71) Applicant: Taiwan Semiconductor Manufacturing Company Limited, Hsin-Chu (TW)

(72) Inventor: Chen-Ting Ko, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 2 days.

(21) Appl. No.: 14/082,614

(22) Filed: Nov. 18, 2013

(65) Prior Publication Data

US 2015/0137875 A1 May 21, 2015

(51) Int. Cl.
*H03K 17/687* (2006.01)
*H01L 25/065* (2006.01)
*H01L 27/02* (2006.01)

(52) U.S. Cl.
CPC .......... *H03K 17/687* (2013.01); *H01L 25/0657* (2013.01); *H01L 27/0251* (2013.01); *H01L 2924/0002* (2013.01)

(58) Field of Classification Search
CPC ............. H03K 17/687; H01L 25/0657; H01L 2924/0002; H01L 27/0251; H01L 2924/00
See application file for complete search history.

(56) References Cited

U.S. PATENT DOCUMENTS

| | | | | |
|---|---|---|---|---|
| 5,962,887 A | * | 10/1999 | Manning et al. | 257/313 |
| 8,276,002 B2 | * | 9/2012 | Dennard et al. | 713/300 |
| 8,471,362 B2 | * | 6/2013 | Lee | G11C 5/025 257/532 |
| 2002/0030273 A1 | * | 3/2002 | Iwamoto et al. | 257/737 |
| 2013/0279276 A1 | * | 10/2013 | Schaefer | 365/189.011 |

* cited by examiner

*Primary Examiner* — Michelle Mandala
(74) *Attorney, Agent, or Firm* — Cooper Legal Group, LLC

(57) ABSTRACT

Among other things, one or more stacked semiconductor arrangements or techniques for applying voltage schemes to such stacked semiconductor arrangements is provided. A stacked semiconductor arrangement comprises one or more tiers, such as a first tier comprising a first semiconductor structure, a second tier comprising a second semiconductor structure, or other tiers. A first voltage domain is applied to the first tier, such as a first substrate voltage of 0v and a first power voltage of 1.6v. A second voltage domain is applied to the second tier, such as a second substrate voltage of 1.6v and a second power voltage of 3.3v. In this way, semiconductor structures having different operational voltages are separated into different tiers, such as to mitigate damage to a lower voltage integrated circuit from a relatively higher voltage for a higher voltage integrated circuit.

20 Claims, 5 Drawing Sheets

STACKED SEMICONDUCTOR ARRANGEMENT

BACKGROUND

As integrated circuits are reduced in size, such as to 28 nm or smaller technology, operating voltages of such integrated circuits are reduced as well. In an example, an integrated circuit utilizes 1.8 v as a voltage for turning on a gate of a transistor. In contrast, older technology, such as USB, utilizes a relatively larger voltage, such as 3.3 v. When a semiconductor arrangement comprises lower voltage integrated circuit technology and higher voltage integrated circuit technology, which can result in over-stress or damage to the lower voltage integrated circuit technology due to relatively higher voltages utilized by the higher voltage integrated circuit technology.

DETAILED DESCRIPTION

Figure 1:
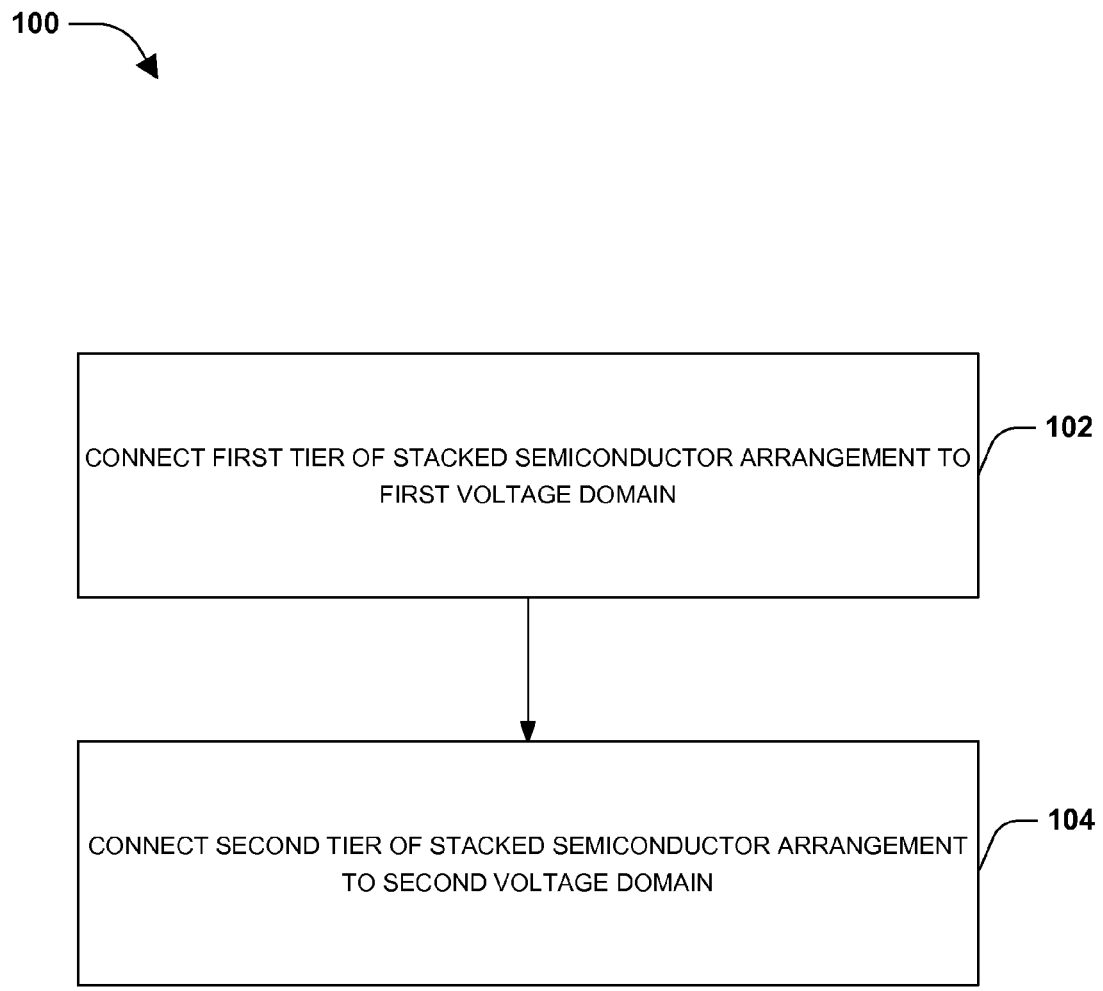
FIG. 1 is a flow diagram illustrating a method of applying a voltage scheme to a stacked semiconductor arrangement, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more stacked semiconductor arrangements or techniques for applying a voltage scheme to such stacked semiconductor arrangements are provided. A stacked semiconductor arrangement comprises one or more tiers within which semiconductor structures, such as integrated circuits, are formed. A first tier is separated from a second tier, such as by at least one of a connectivity layer, dielectric material, or air, to provide over-stress design for protecting relatively lower voltage semiconductor structures from relatively higher voltages used to power relatively higher voltage semiconductor structures. In some embodiments, the first tier comprises relatively lower voltage semiconductor structures that are powered by a relatively lower voltage, such as 1.8 v, and the second tier comprises relatively higher voltage semiconductor structures that are powered by a relatively higher voltage, such as 3.3 v. In this way, the relatively lower voltage semiconductor structures of the first tier are protected from damage resulting from the 3.3 v supplied to the second tier. One or more connectivity structures, such as metal pillars, are used to electrically couple the first tier and the second tier. The stacked semiconductor arrangement provides over-stress design by separating semiconductor structures into a plurality of tiers corresponding to various voltages, which mitigates area or resistivity penalties otherwise resulting from utilizing n-wells, deep n-wells, r-wells, or other separation techniques within a single wafer having a non-tiered design that has different semiconductor structures powered by varying voltages.

Figure 2:
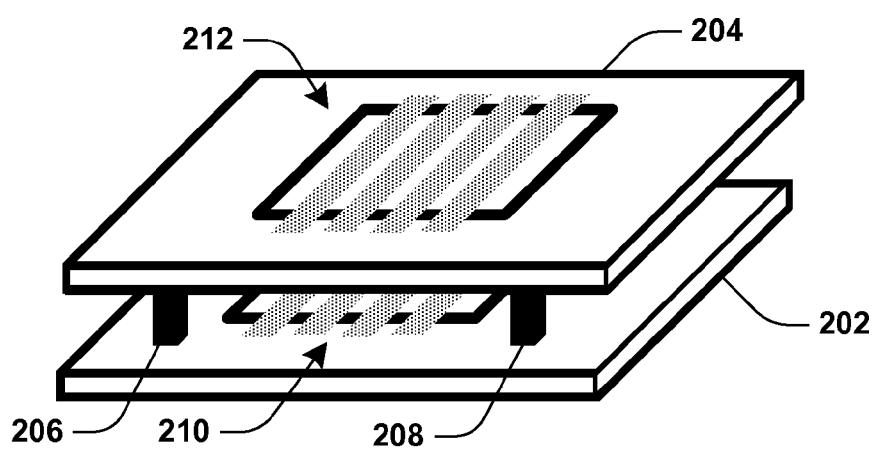
FIG. 2 is an illustration of a stacked semiconductor arrangement, according to some embodiments.
Figure 3:
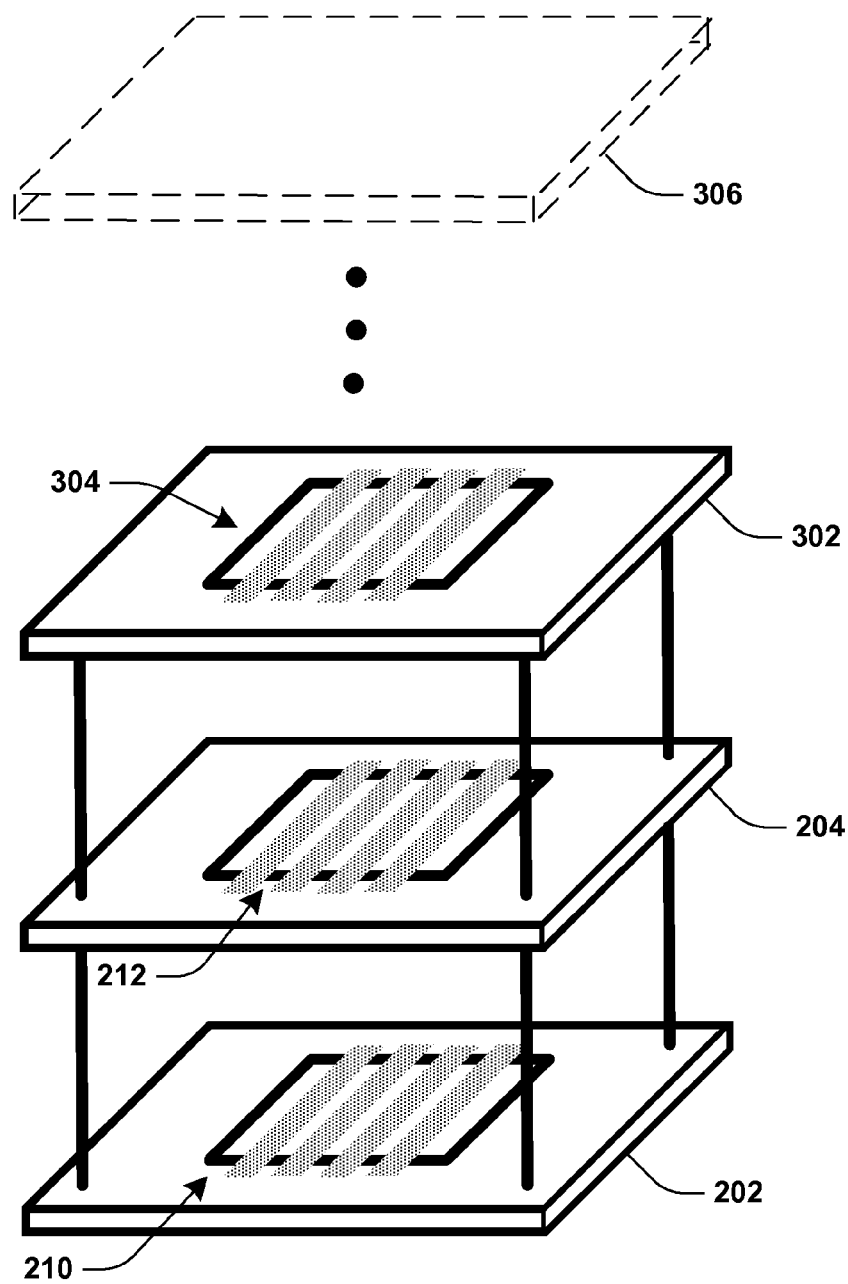
FIG. 3 is an illustration of a stacked semiconductor arrangement comprising a plurality of tiers, according to some embodiments.

A method 100 of applying a voltage scheme to a stacked semiconductor arrangement is illustrated in FIG. 1. In some embodiments, a stacked semiconductor arrangement 200, such as a CMOS stacked semiconductor arrangement or other arrangement of semiconductors formed according to a stacked 3D design, comprises one or more tiers such as a first tier 202 and a second tier 204, as illustrated in FIG. 2. The first tier 202 comprises a first semiconductor structure 210, such as one or more transistors, integrated circuits, or other semiconductor devices. The second tier 204 comprises a second semiconductor structure 212, such as one or more transistors, integrated circuits, or other semiconductor devices. It is appreciated that a stacked semiconductor arrangement can comprise any number of tiers such as a third tier 302 comprising a third semiconductor structure 304 or a fourth tier 306, as illustrated in FIG. 3. The first semiconductor structure 210 utilizes a first voltage domain and the second semiconductor structure 212 utilizes a second voltage domain different than the first voltage domain. In some embodiments, the first semiconductor structure 210 utilizes a relatively lower voltage, such as 1.8 v to power gates of transistors within the first semiconductor structure 210, and the second semiconductor structure 212 utilizes a relatively higher voltage, such as 3.3 v to power gates of transistors within the second semiconductor structure 212. In some embodiments, the first semiconductor structure 210 utilizing a relatively higher voltage, such as 5 v to power gates of transistors within the first semiconductor structure 210, and the second semiconductor structure 212 utilizes a relatively lower voltage, such as 0.6 v to power gates of transistors within the second semiconductor structure 212. In this way, tiers of the stacked semiconductor arrangement 200 comprise semiconductor structures that utilize different voltages, such as the third semiconductor structure 304 of the third tier 302 utilizing a third voltage domain different than the first voltage domain and the second voltage domain. In some embodiments, voltage domains are sequentially ordered from lower voltage tiers to higher voltage tiers where a higher voltage tier is formed over a lower voltage tier. In some embodiments, voltage domains are sequentially ordered from higher voltage tiers to lower voltage tiers where a lower voltage tier is formed over a higher voltage tier. In some embodiments, voltage domains are not sequentially ordered amongst tiers of the stacked semiconductor arrangement 200, but can have any ordering such as where the first tier 202 corresponds to a 3.3 v voltage domain, the second tier 204 corresponds to a 0.6 v voltage domain, the third tier 304 corresponds to a 5 v voltage domain, the fourth tier 306 corresponding to the 0.6 v voltage domain, etc.

In some embodiments, a tier of the stacked semiconductor arrangement 200 comprises at least one nMOS semiconductor structure and at least one pMOS semiconductor structure. In some embodiments, a tier of the stacked semiconductor arrangement 200 comprises one or more nMOS semiconductor structures, but no pMOS semiconductor structures. In some embodiments, a tier of the stacked semiconductor arrangement 200 comprises one or more pMOS semiconductor structures, but no nMOS semiconductor structures. In some embodiments, the first semiconductor structure 210 of the first tier 202 comprises pMOS semiconductor structures, but no nMOS semiconductor structures, and the second semiconductor structure 212 of the second tier 204 comprises nMOS semiconductor structures, but no pMOS semiconductor structures. In some embodiments where tiers are designated to particular types of semiconductors, processing of the stacked semiconductor arrangement 200 is improved, such as improving yield or reducing metal gate and source/drain EPI because nMOS structures and pMOS structures are formed and processed separately.

In some embodiments, tiers within the stacked semiconductor arrangement 200 are separated by connectivity layers. In some embodiments, the first tier 202 is separated from the second tier 204 by a first connectivity layer, such as a dielectric layer, air, or other material. In some embodiments, the first tier 202, such as the first semiconductor structure 210 is electrically connected to the second tier 204, such as the second semiconductor structure 212, using one or more conductive structures within the first connectivity layer, such as a first metal structure 206 and a second metal structure 208. In some embodiments, the first tier 202 is formed from a first semiconductor wafer and the second tier 204 is formed from a second semiconductor wafer. In this way, the stacked semiconductor arrangement 200 is formed from one or more semiconductor wafers arranged according to a stacked 3D structure. In some embodiments, because tiers are separated from one another, such as by connectivity layers, due to being arranged according to the stacked 3D structure, N-wells, deep N-wells, R-wells, or other separation structures used to separate semiconductor structures of differing voltage domains within a single wafer are not used. Not utilizing separation structures mitigates area and resistivity penalties otherwise resulting from additional area used to form such separation structures around relatively higher voltage semiconductor structures and additional resistance occurring from increasing lengths of metal line connections due to the additional area used for separation structures.

At 102, the first tier 202 of the stacked semiconductor arrangement 200 is connected to a first voltage domain. The first voltage domain comprises a first substrate voltage and a first power voltage. In some embodiments, the first substrate voltage corresponds to a reference ground voltage or a body voltage for the first semiconductor structure 210, such as 0 v. In some embodiments, the first power voltage corresponds to a voltage, such as 0.6 v, used to turn on a gate of a transistor or to activate a device within the first semiconductor structure 210. At 104, the second tier 204 of the stacked semiconductor arrangement 200 is connected to a second voltage domain different than the first voltage domain. The second voltage domain comprises a second substrate voltage and a second power voltage. In some embodiments, the second substrate voltage corresponds to a reference ground voltage or a body voltage for the second semiconductor structure 210, such as 1 v. In some embodiments, the second power voltage corresponds to a voltage, such as 1.6 v, used to turn on a gate of a transistor or to activate a device within the second semiconductor structure 212.

In some embodiments, a voltage domain, such as a power voltage of a voltage domain, is selectively tunable according to various tuning modes. In some embodiments, a voltage domain is tunable to a power saving mode voltage, such as tuning the first power voltage to 0.6 v or below. In some embodiments, a voltage domain is tunable to an enhanced speed voltage, such as 0.6 v or above such as 1 v. In some embodiments, a power saving mode voltage of the first tier 202 is less than the second substrate voltage of the second tier 204. In some embodiments, the enhanced speed voltage for the first tier 202 corresponds to the second voltage domain of the second tier 204, such as a voltage between the second substrate voltage and the second power voltage. In this way, a voltage domain is selectively tunable to various voltages to provide for power savings or enhanced operating speeds.

Figure 4:
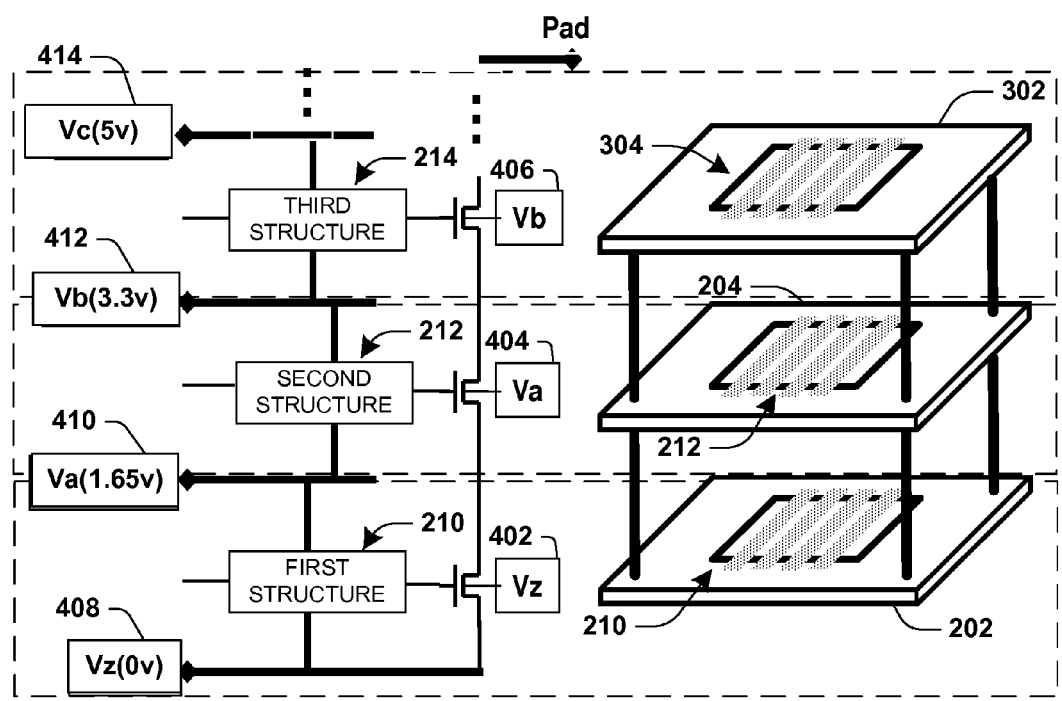
FIG. 4 is an illustration of a voltage scheme applied to a stacked semiconductor arrangement, according to some embodiments.

FIG. 4 illustrates a voltage scheme applied to the stacked semiconductor arrangement 200. A first voltage domain (Vz) 402 is applied to the first tier 202. The first voltage domain (Vz) 402 comprises a first voltage (Vz=0 v) 408 that is used as a first substrate voltage (0 v), such as a reference ground voltage or body voltage, for the first semiconductor structure 210. The first voltage domain (Vz) 402 comprises a second voltage (Va=1.65 v) 410 that is used as a first power voltage (1.65 v), such as a voltage used to turn on a gate of a transistor or to activate a device within the first semiconductor structure 210. In some embodiments, the first voltage domain (Vz) 402 is selectively tunable, such as between about 0 v to about 1.65 v.

A second voltage domain (Va) 404 is applied to the second tier 204. The second voltage domain (Va) 404 comprises the second voltage (Va=1.65 v) 410 that is used as a second substrate voltage (1.65 v), such as a reference ground voltage or body voltage, for the second semiconductor structure 212. The second voltage domain (Va) 404 comprises a third voltage (Vb=3.3 v) 412 that is used as a second power voltage (3.3 v), such as a voltage used to turn on a gate of a transistor or to activate a device within the second semiconductor structure 212. In some embodiments, the second voltage domain (Va) 404 is selectively tunable, such as between about 1.65 v to about 3.3 v.

A third voltage domain (Vb) 406 is applied to the third tier 304. The third voltage domain (Vb) 406 comprises the third voltage (Vb=3.3 v) 412 that is used as a third substrate voltage (3.3 v), such as a reference ground voltage or body voltage, for the third semiconductor structure 304. The third voltage domain (Vb) 406 comprises a third voltage (Vc=5 v) 414 that is used as a third power voltage (5 v), such as a voltage used to turn on a gate of a transistor or to activate a device within the third semiconductor structure 304. In some embodiments, the third voltage domain (Vb) 406 is selectively tunable, such as between about 3.3 v to about 5 v.

Figure 5:
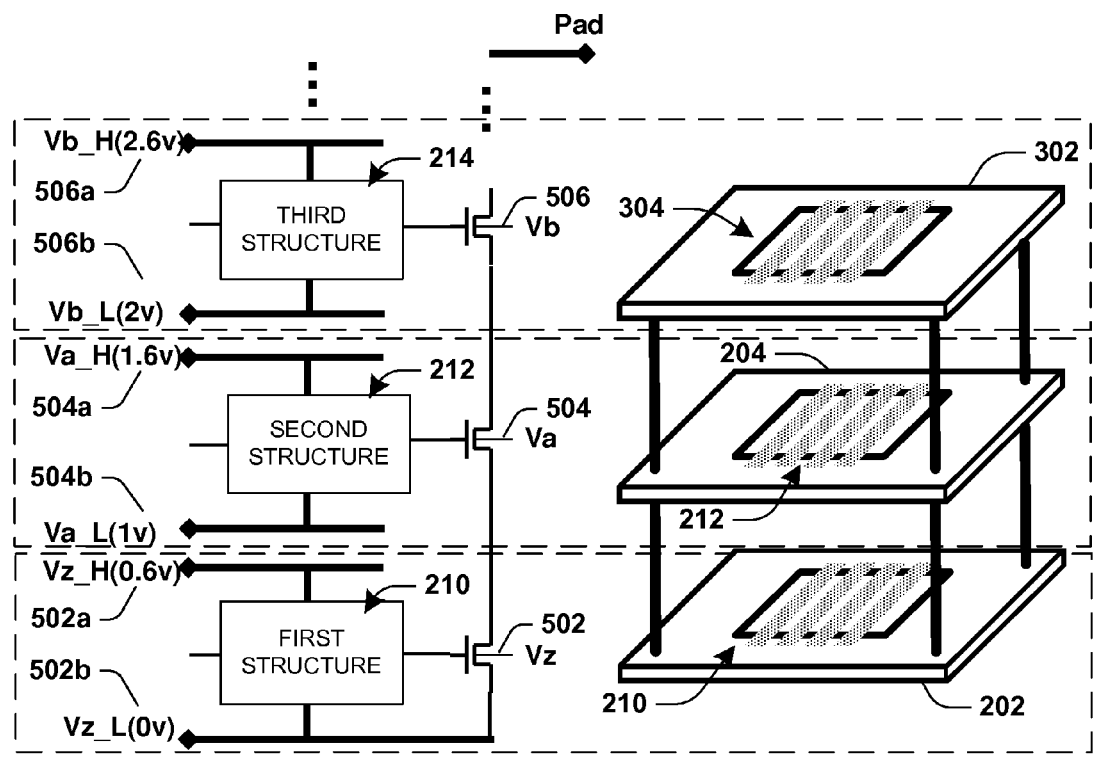
FIG. 5 is an illustration of a voltage scheme applied to a stacked semiconductor arrangement, according to some embodiments.

FIG. 5 illustrates a tunable voltage scheme applied to the stacked semiconductor arrangement 200. A first voltage domain (Vz) 502 is applied to the first tier 202. The first voltage domain (Vz) 502 comprises a first low voltage (Vz_L=0 v) 502b that is used as a first substrate voltage, such as a reference ground voltage or body voltage, for the first semiconductor structure 210. The first voltage domain (Vz) 502 comprises a first high voltage (Vz_H=0.6 v) 502a that is used as a first power voltage, such as a voltage used to turn on a gate of a transistor or to activate a device within the first semiconductor structure 210. In some embodiments, the first voltage domain (Vz) 502 is selectively tunable, such as between about 0 v to about 0.6 v. In some embodiments, the first power voltage is selectively tuned from the first high voltage (Vz_H=0.6 v) to an enhanced speed voltage (1 v) corresponding to a second low voltage (Va_L=1 v) 504b of a second voltage domain (Va) 504. In some embodiments, the first power voltage is selectively tuned to a power saving mode voltage, such as the first high voltage (Vz_H=0.6 v) or a smaller voltage.

The second voltage domain (Va) 504 is applied to the second tier 204. The second voltage domain (Va) 504 comprises the second low voltage (Va_L=1 v) 504b that is used as a second substrate voltage, such as a reference ground voltage or body voltage, for the second semiconductor structure 212. The second voltage domain (Va) 504 comprises a second high voltage (Va_H=1.6 v) 504a that is used as a second power voltage, such as a voltage used to turn on a gate of a transistor or to activate a device within the second semiconductor structure 212. In some embodiments, the second voltage domain (Va) 504 is selectively tunable, such as between about 1 v to about 1.6 v. In some embodiments, the second power voltage is selectively tuned from the second high voltage (Va_H=1.6 v) to an enhanced speed voltage (2 v) corresponding to a third low voltage (Vb_L=2 v) 506*b* of a third voltage domain (Vb) 506. In some embodiments, the second power voltage is selectively tuned to a power saving mode voltage, such as the second high voltage (Va_H=1.6 v) or a smaller voltage.

The third voltage domain (Vb) 506 is applied to the third tier 302. The third voltage domain (Vb) 506 comprises the third low voltage (Vb_L=2 v) 506*b* that is used as a third substrate voltage, such as a reference ground voltage or body voltage, for the third semiconductor structure 304. The third voltage domain (Vb) 506 comprises a third high voltage (Vb_H=2.6 v) 506*a* that is used as a third power voltage, such as a voltage used to turn on a gate of a transistor or to activate a device within the third semiconductor structure 304. In some embodiments, the third voltage domain (Vb) 506 is selectively tunable, such as between about 2 v to about 2.6 v. In some embodiments, the third power voltage is selectively tuned from the third high voltage (Vz_H=2.6 v) to an enhanced speed voltage, such as a voltage corresponding to a fourth low voltage (Vc_L=4 v) of a fourth voltage domain not illustrated. In some embodiments, the third power voltage is selectively tuned to a power saving mode voltage, such as the third high voltage (Vz_H=2.6 v) or a smaller voltage.

According to an aspect of the instant disclosure, a stacked semiconductor arrangement is provided. The stacked semiconductor arrangement comprises a first tier. The first tier comprises a first semiconductor structure. The first tier is configured with a first voltage domain. The stacked semiconductor arrangement comprises a second tier. The second tier is formed over the first tier. The second tier comprises a second semiconductor structure. The second tier is configured with a second voltage domain different than the first voltage domain.

According to an aspect of the instant disclosure, a stacked semiconductor arrangement is provided. The stacked semiconductor arrangement comprises a plurality of tiers. The plurality of tiers comprises a first tier. The first tier comprises a first semiconductor structure. The first tier is configured with a first voltage domain. The first voltage domain comprises a first substrate voltage and a first power voltage. The plurality of tiers comprises a second tier. The second tier comprises a second semiconductor structure. The second tier is configured with a second voltage domain. The second voltage domain comprises a second substrate voltage. The second substrate voltage is different than the first substrate voltage. The second voltage domain comprises a second power voltage. The second power voltage is different than the first power voltage.

According to an aspect of the instant disclosure, a method for applying a voltage scheme to a stacked semiconductor arrangement is provided. The method comprises connecting a first tier of a stacked semiconductor arrangement to a first voltage domain. The first voltage domain comprises a first substrate voltage and a first power voltage. A second tier of the stacked semiconductor arrangement is connected to a second voltage domain. The second voltage domain comprises a second substrate voltage different than the first substrate voltage. The second voltage domain comprises a second power voltage different than the first power voltage.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A stacked semiconductor arrangement, comprising:
a first tier comprising a first semiconductor structure and a first transistor, the first semiconductor structure coupled to a gate of the first transistor and configured to activate the first transistor, the first tier configured with a first voltage domain; and
a second tier, formed over the first tier, comprising a second semiconductor structure and a second transistor, the second semiconductor structure coupled to a gate of the second transistor and configured to activate the second transistor, a source/drain region of the first transistor coupled to a source/drain region of the second transistor, the second tier configured with a second voltage domain different than the first voltage domain.

2. The stacked semiconductor arrangement of claim 1, wherein the first tier and the second tier are configured as a stacked 3D design.

3. The stacked semiconductor arrangement of claim 1, wherein the first tier is separated from the second tier by a connectivity layer, the first transistor coupled to the second transistor by one or more conductive structures within the connectivity layer.

4. The stacked semiconductor arrangement of claim 1, wherein the first voltage domain has a lower voltage than the second voltage domain.

5. The stacked semiconductor arrangement of claim 1, wherein the first voltage domain has a higher voltage than the second voltage domain.

6. The stacked semiconductor arrangement of claim 1, further comprising:
a plurality of tiers comprising semiconductor structures, the plurality of tiers comprising the first tier, the second tier, and a third tier comprising a third semiconductor structure, the third tier configured with a third voltage domain different than the first voltage domain and the second voltage domain.

7. The stacked semiconductor arrangement of claim 1, wherein the second semiconductor structure is not separated from the first semiconductor structure by at least one of an N-well, a deep N-well, or an R-well.

8. The stacked semiconductor arrangement of claim 1, wherein the first tier is formed from a first semiconductor wafer and the second tier formed from a second semiconductor wafer.

9. The stacked semiconductor arrangement of claim 1, further comprising:
a third tier, formed over the second tier, comprising a third semiconductor structure, the third tier configured with a third voltage domain lower than the first voltage domain and higher than the second voltage domain.

10. The stacked semiconductor arrangement of claim 1, wherein the first tier comprises at least of:
an nMOS device and no pMOS devices; or
a pMOS device and no nMOS devices.

11. The stacked semiconductor arrangement of claim 1, wherein the first semiconductor structure comprises a first nMOS device and a first pMOS device.

12. The stacked semiconductor arrangement of claim 1, wherein the first semiconductor structure comprises one or more nMOS devices, and the second semiconductor structure comprises one or more pMOS devices.

13. The stacked semiconductor arrangement of claim 1, wherein the first voltage domain comprises a first substrate voltage and a first power voltage.

14. The stacked semiconductor arrangement of claim 13, wherein the second voltage domain comprises a second substrate voltage and a second power voltage, the second substrate voltage corresponding to the first substrate voltage.

15. The stacked semiconductor arrangement of claim 13, wherein the first power voltage is selectively tuned to either a power saving mode voltage or an enhanced speed voltage.

16. The stacked semiconductor arrangement of claim 15, wherein the power saving mode voltage is less than a second substrate voltage of the second voltage domain, the enhanced speed voltage corresponding to a lower limit of the second voltage domain.

17. A stacked semiconductor arrangement, comprising:
a first tier comprising a first semiconductor structure and a first transistor, the first semiconductor structure coupled to a gate of the first transistor and configured to activate the first transistor, the first tier configured with a first voltage domain comprising a first substrate voltage and a first power voltage; and
a second tier, formed over the first tier, comprising a second semiconductor structure and a second transistor, the second semiconductor structure coupled to a gate of the second transistor and configured to activate the second transistor, a source/drain region of the first transistor coupled to a source/drain region of the second transistor, the second tier configured with a second voltage domain different than the first voltage domain and comprising a second substrate voltage and a second power voltage.

18. The stacked semiconductor arrangement of claim 17, wherein the second substrate voltage is equal to the first substrate voltage.

19. The stacked semiconductor arrangement of claim 17, wherein:
the first power voltage is different than the first substrate voltage;
the second power voltage is different than the first power voltage; and
the second power voltage is different than the second substrate voltage.

20. A stacked semiconductor arrangement, comprising:
a first tier comprising a first semiconductor structure and a first transistor, the first semiconductor structure coupled to a gate of the first transistor and configured to activate the first transistor, the first tier configured with a first voltage domain comprising a first power voltage, the first power voltage is selectively tuned to either a power saving mode voltage or an enhanced speed voltage; and
a second tier, formed over the first tier, comprising a second semiconductor structure and a second transistor, the second semiconductor structure coupled to a gate of the second transistor and configured to activate the second transistor, a source/drain region of the first transistor coupled to a source/drain region of the second transistor, the second tier configured with a second voltage domain different than the first voltage domain.

* * * * *